(12) United States Patent
Choi et al.

(10) Patent No.: US 7,990,779 B2
(45) Date of Patent: Aug. 2, 2011

(54) METHOD OF OPERATING SEMICONDUCTOR DEVICES

(75) Inventors: Sang-moo Choi, Yongin-si (KR); Won-joo Kim, Hwaseong-si (KR); Tae-hee Lee, Yongin-si (KR)

(73) Assignee: Samsung Electronics Co., Ltd., Gyeongg-do (KR)

( * ) Notice: Subject to any disclaimer, the term of this patent is extended or adjusted under 35 U.S.C. 154(b) by 124 days.

(21) Appl. No.: 12/585,540

(22) Filed: Sep. 17, 2009

(65) Prior Publication Data
US 2010/0118623 A1    May 13, 2010

(30) Foreign Application Priority Data

Nov. 10, 2008  (KR) .................. 10-2008-0111216

(51) Int. Cl.
*G11C 7/00* (2006.01)
(52) U.S. Cl. .............. 365/189.11; 365/185.24
(58) Field of Classification Search ............ 365/189.11, 365/185.24
See application file for complete search history.

(56) References Cited

U.S. PATENT DOCUMENTS

| | | | | |
|---|---|---|---|---|
| 6,787,835 | B2 * | 9/2004 | Atwood et al. | 257/296 |
| 6,949,782 | B2 * | 9/2005 | Atwood et al. | 257/296 |
| 7,139,214 | B2 * | 11/2006 | Atwood et al. | 365/149 |
| 7,212,441 | B2 * | 5/2007 | Yamazoe et al. | 365/185.11 |
| 7,499,310 | B2 * | 3/2009 | Park et al. | 365/154 |
| 2005/0219934 | A1 * | 10/2005 | Hanzawa et al. | 365/230.06 |
| 2008/0080238 | A1 * | 4/2008 | Yuda | 365/185.03 |

FOREIGN PATENT DOCUMENTS

| | | |
|---|---|---|
| JP | 2007-018588 | 1/2007 |
| JP | 2007-073680 | 3/2007 |
| JP | 2007-141890 | 6/2007 |
| JP | 2007-287975 | 11/2007 |

* cited by examiner

*Primary Examiner* — Michael T Tran
(74) *Attorney, Agent, or Firm* — Harness, Dickey & Pierce, PLC

(57) ABSTRACT

A method of operating a semiconductor device including a memory cell of a 1-T DRAM is provided in which a gate voltage level in a hold mode is adjusted to adjust a data sensing margin of the semiconductor device.

20 Claims, 7 Drawing Sheets

METHOD OF OPERATING SEMICONDUCTOR DEVICES

PRIORITY STATEMENT

This application claims priority under 35 U.S.C. §119 to Korean Patent Application No. 10-2008-0111216, filed on Nov. 10, 2008, in the Korean Intellectual Property Office (KIPO), the entire contents of which is incorporated herein by reference.

BACKGROUND

1. Field

Example embodiments relate to methods of operating semiconductor devices, and more particularly, to methods of operating semiconductor devices that include adjusting gate voltage level in a hold mode.

2. Description of the Related Art

A conventional memory, for example, a DRAM, may include one transistor and one capacitor as a memory cell. However, there are limitations to the scalability of the conventional memory, due to the capacitor, in particular, the size of the capacitor. As a result, a memory including one transistor (1T) and no capacitor as a memory cell, referred to as 'a capacitor-less memory or 1-T DRAM', has been studied. The 1-T DRAM may be simple to manufacture and it may be easy to make a memory device with larger density.

SUMMARY

Example embodiments provide a method of operating a semiconductor device that includes adjusting a gate voltage level in a hold mode.

According to example embodiments, there is provided a method of operating a semiconductor device having at least one memory cell including a drain region, a source region, a floating body region, and a gate electrode, the method including: applying a first gate voltage to the gate electrode and a first drain voltage to the drain region, in a write mode, to change a data state of the memory cell to a first state; applying an adjustable second gate voltage to the gate electrode and a second drain voltage to the drain region, in a hold mode after the write mode.

The voltage level of the second gate voltage may be adjusted so that an amount of carriers (e.g., holes) stored in the floating body region may be adjusted. The voltage level of the second gate voltage may be adjustable in a range where the voltage level of the second gate voltage is negative. The voltage level of the second gate voltage may be less than the voltage level of the first gate voltage, and the voltage level of the second drain voltage may be less than the voltage level of the first drain voltage.

According to example embodiments, there is provided a method of operating at least one semiconductor device including a drain region, a source region, a floating body region, and a gate pattern, the method including: applying a first gate voltage to the gate pattern and a first drain voltage to the drain region, in a write mode, to change a data state of the semiconductor device to a first state; and applying a second gate voltage to the gate pattern and a second drain voltage to the drain region, in a hold mode after the write mode, the difference between the first gate voltage and the second gate voltage being an adjustable difference.

According to example embodiments, there is provided a method of operating at least one semiconductor device, the semiconductor device including a drain region, a source region, a floating body region, and a gate electrode, the method including: applying an activation period of a gate voltage pulse to the gate electrode and applying an activation period of a drain voltage pulse to the drain region, in a write mode, to change the data state of the semiconductor device to a first state; applying a deactivation period of the gate voltage pulse to the gate electrode, a voltage level of the deactivation period of the voltage pulse being adjustable, and applying a deactivation period of the drain voltage pulse to the drain region, in a hold mode after the write mode.

BRIEF DESCRIPTION OF THE DRAWINGS

Example embodiments will be more clearly understood from the following brief description taken in conjunction with the accompanying drawings.

FIG. 1 is a cross-sectional diagram illustrating an example memory cell of a one transistor-dynamic random access memory (1T-DRAM) device according to example embodiments;

FIG. 2 is a circuit diagram of the memory cell of FIG. 1;

FIG. 3 is a cross-sectional diagram illustrating carrier generation in a write mode of the memory cell of FIG. 1;

FIG. 4 is a cross-sectional diagram illustrating carrier storage after the write mode of the memory cell of FIG. 3;

FIG. 5 is a cross-sectional diagram illustrating the absence of carrier storage in the memory cell of FIG. 1;

FIG. 6 is a graph of drain/source current ($I_{ds}$) as a function of gate voltage ($V_g$) for a read operation, illustrating a sense margin of the memory cell of FIG. 1;

FIG. 7 is a graph of voltage as a function of time, illustrating voltage pulses divided into a write mode and a hold mode, according to example embodiments;

FIG. 8 is a cross-sectional diagram illustrating a carrier concentration distribution generated in the write mode of FIG. 7;

FIGS. 9-11 are cross-sectional diagrams illustrating carrier concentration distributions generated in the hold mode of FIG. 7;

FIG. 12 is a graph of drain/source current ($I_{ds}$) as a function of gate voltage (V) of a read operation, illustrating sense margins resulting from gate voltage pulses applied in a write mode and a hold mode, according to example embodiments; and FIGS. 13 and 14 are cross-sectional diagrams illustrating memory cells of 1T-DRAM devices according to example embodiments.

Figure 1:
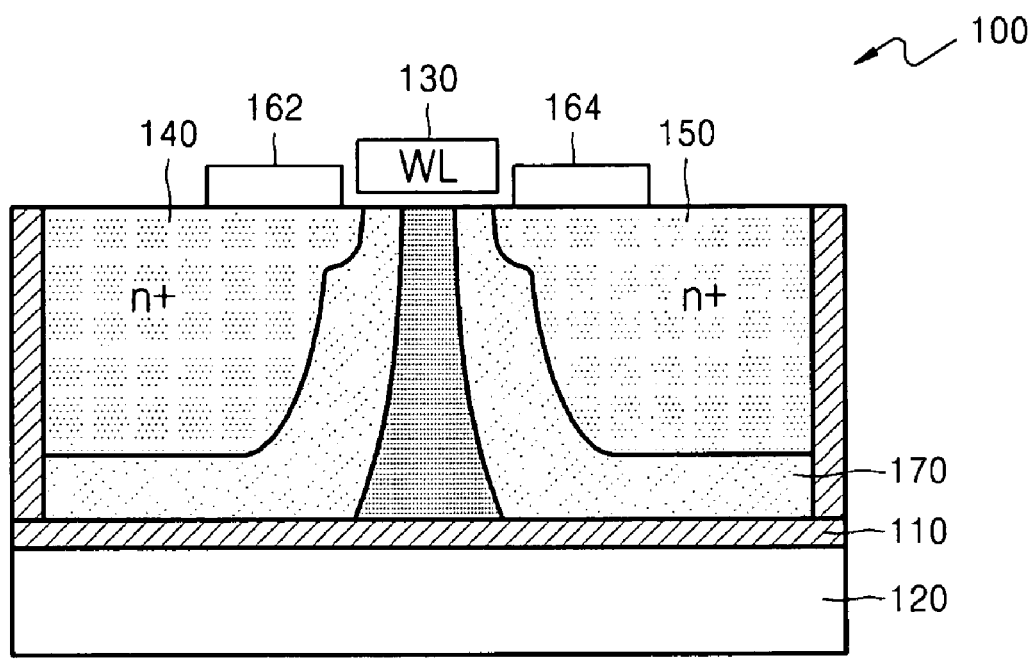
FIGS. 1-14 represent non-limiting, example embodiments as described herein.

It should be noted that these Figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION OF EXAMPLE EMBODIMENTS

Example embodiments will now be described more fully with reference to the accompanying drawings, in which example embodiments are shown. Example embodiments may, however, be embodied in many different forms and should not be construed as being limited to the embodiments set forth herein; rather, these embodiments are provided so that this disclosure will be thorough and complete, and will fully convey the concept of example embodiments to those of ordinary skill in the art. In the drawings, the thicknesses of layers and regions are exaggerated for clarity. Like reference numerals in the drawings denote like elements, and thus their description will be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

FIG. 1 is a cross-sectional diagram illustrating an example memory cell 100 of a 1T-DRAM device, which may be operated using methods of operating semiconductor devices according to example embodiments. A memory cell 100 of the 1T-DRAM device of FIG. 1 may include an insulating layer 110 on a semiconductor substrate 120, a body region 170, a gate electrode 130, a source electrode 162, a drain electrode 164, a source region 140, and a drain region 150. The source region 140 and the drain region 150 may be doped. According to example embodiments, the source region 140 and the drain region 150 may be interchanged with each other, and therefore the source electrode 162 and the drain electrode 164 may be interchanged with each other. For example, the semiconductor device of FIG. 1 may be bi-directional. A gate voltage, a drain voltage, and a source voltage, which are applied to the gate electrode 130, the source electrode 162, and the drain electrode 164, respectively, may be adjusted so that data can be written, erased, and/or read in the memory cell 100 of the 1T-DRAM device.

Figure 2:
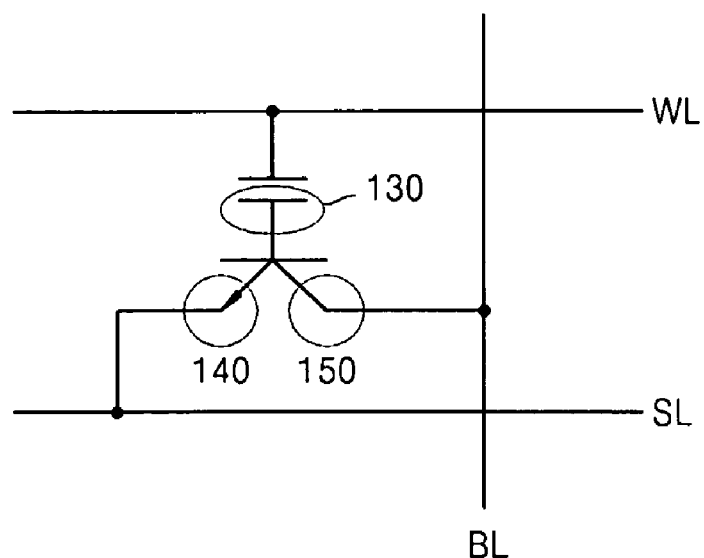

FIG. 2 is a circuit diagram of the example memory cell 100 of FIG. 1 connected to a source line SL, a bit line BL and a word line WL. Referring to FIGS. 1 and 2, the source region 140 may be connected to the source line SL through the source electrode 162 and the drain region 150 may be connected to the bit line BL through the drain electrode 164. The source voltage may be supplied to the source region 140 through the source line SL and the drain voltage may be supplied to the drain region 150 through the bit line BL. Although the bit line BL and the source line SL are particularly shown in FIG. 2, in a reverse operation of the 1T-DRAM device, the source line SL may become the bit line BL and the bit line BL may become the source line SL. The gate electrode 130 may be connected to a word line WL and the gate voltage may be supplied to the gate electrode 130 through the word line WL.

Figure 3:
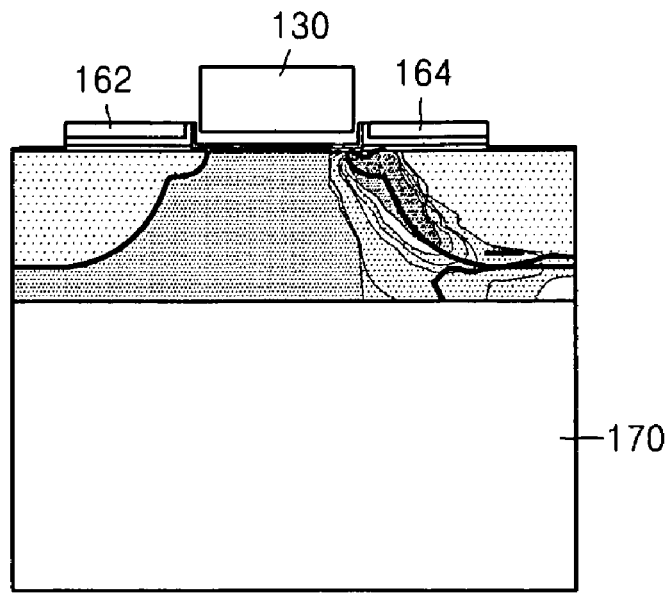
Figure 4:
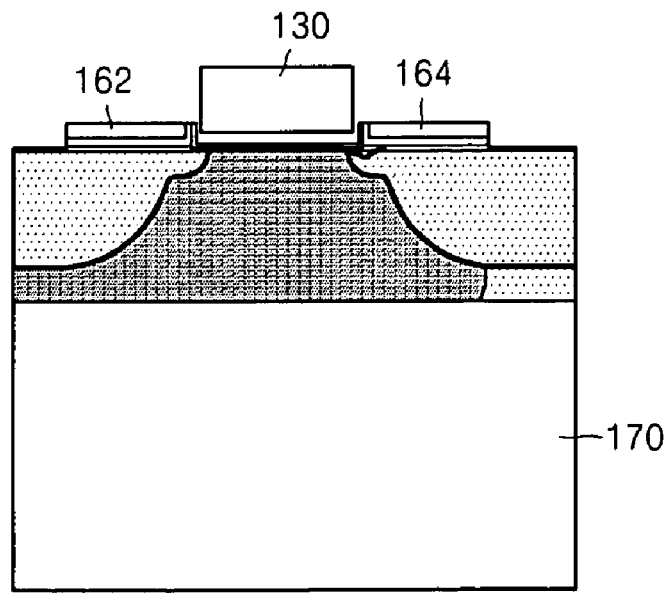
Figure 5:
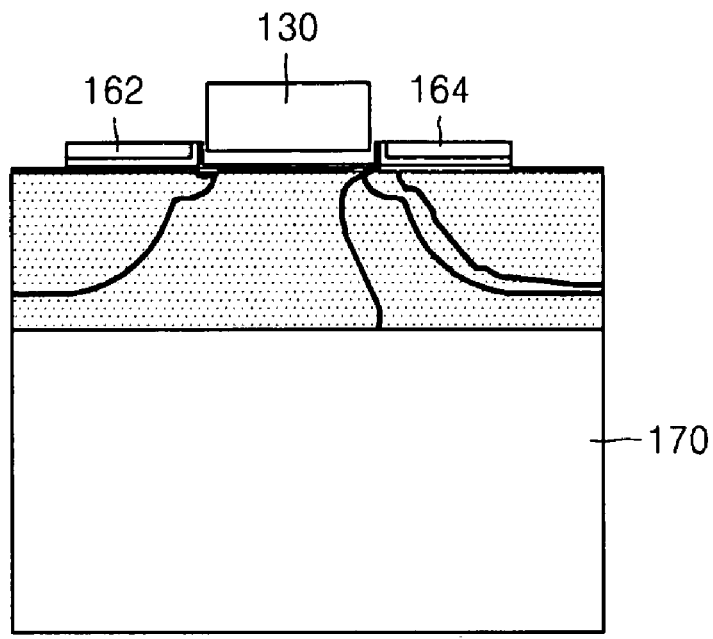

FIG. 3 is a cross-sectional diagram illustrating carrier generation in a write mode of the memory cell 100 of FIG. 1. FIG. 4 is a cross-sectional diagram illustrating carrier storage after the write mode of the memory cell of FIG. 3. FIG. 5 is a cross-sectional diagram illustrating the absence of carrier storage in the memory cell of FIG. 1.

In a write mode, a plurality of electron-hole pairs may be generated under a given voltage bias condition by impact ionization or avalanche breakdown in a portion of the memory cell where the body region 170 and the drain region 150 contact each other, illustrated in FIG. 3. The generated electrons may be moved into the drain region 150 and the generated holes (majority carriers) may be moved into the body region 170 under the given voltage bias condition. Referring to FIG. 3, majority carriers generated due to impact ionization may be stored in the body region 170. Carrier concentration in a region indicated by intermediate shading is higher than a carrier concentration in a region indicated by light shading. When carriers are stored in the body region 170 (e.g., high and/or increased carrier concentration) the memory cell 100 may have a data value of "1". Referring to FIG. 5, when carriers are not generated in the write mode, or are removed in an erase mode, carriers are not stored in the body region 170. A region indicated by light shading indicates that carrier concentration is low relative to a region in which carriers are stored. When carriers are not stored in the body region 170 (e.g., low and/or decreased carrier concentration) the memory cell 100 may have a data value of "0".

In a read mode, data may be read from the memory cell 100 of 1T-DRAM device by measuring the amount of current that flows between the drain region 150 and the source region 140 when a gate read voltage is applied to the gate electrode 130. When carriers are stored in the body region 170, the amount of current that flows between the drain region 150 and the source region 140 may be high and/or increased. When carriers are not stored in the body region 170, the amount of current that flows between the drain region 150 and the source region 140 may be small and/or decreased.

Figure 6:
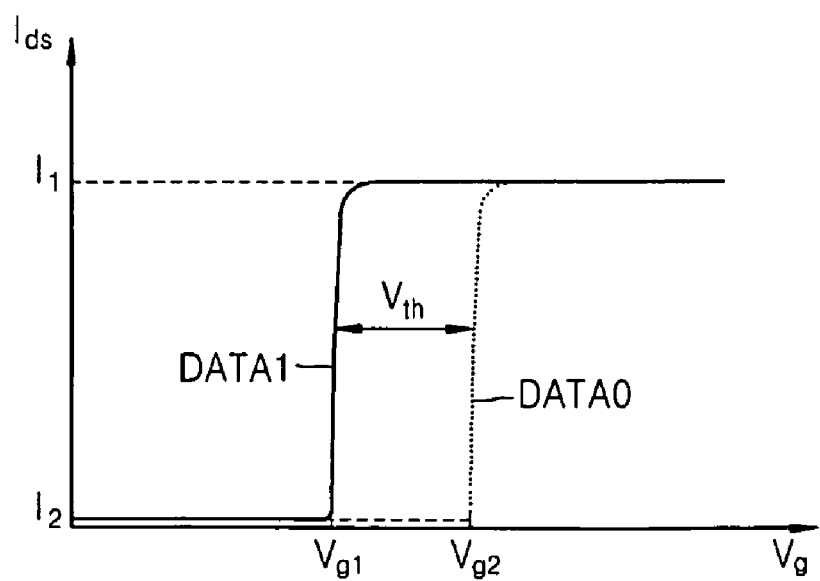

FIG. 6 is a graph of drain/source current ($I_{ds}$) as a function of gate voltage ($V_g$), illustrating a sense margin of the memory cell of FIG. 1. Referring to FIG. 6, when the memory cell 100 of a 1T-DRAM device has a data value of "1" (e.g., when carriers are stored in the body region 170), a sense current may correspond to the DATA1 curve. When the 1T-DRAM device 100 has a data value of "0" (e.g., when carriers are not stored in the body region 170), a sense current may be illustrated by the DATA0 curve. If the data value of the memory cell 100 of the 1T-DRAM device is "1" and a read voltage between a first gate voltage $V_{g1}$ and a second gate voltage $V_{g2}$ is applied to the gate electrode 130, a large and/or increased current $I_1$ may flow between the source region 140 and the drain region 150. If the data value of the 1T-DRAM device 100 is "0" and the read voltage between a first gate voltage $V_{g1}$ and a second gate voltage $V_{g2}$ is applied to the gate electrode 130, a small and/or decreased current $I_2$ may flow between the source region 140 and the drain region 150. The data value stored in the memory cell of a 1T-DRAM device may be determined by sensing whether the sense current is $I_1$ (e.g., data value "1") or $I_2$ (e.g., data value "0"). A difference between the first gate voltage $V_{g1}$ and the second gate voltage $V_{g2}$ is referred to as a sense margin, denoted by $\Delta V$th in FIG. 6. The sense margin refers to the difference between the threshold voltage of the memory cell of a 1T-DRAM device when carriers are stored and when carriers are not stored.

Figure 7:
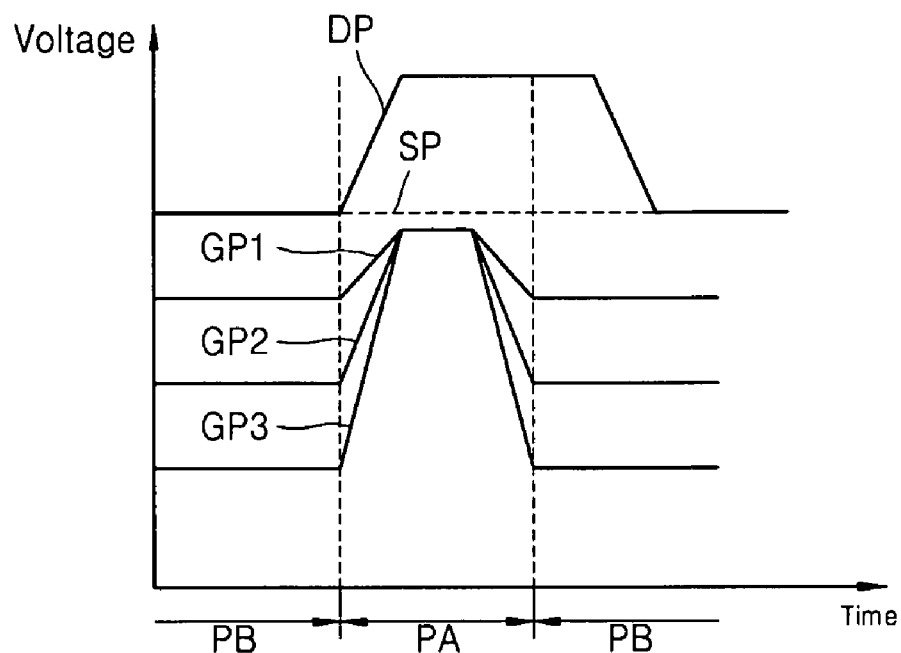

FIG. 7 is a graph of voltage as a function of time, illustrating voltage pulses divided into a write mode PA and a hold mode PB, according to example embodiments. Referring to FIG. 7, the semiconductor device including the memory cell of a 1T-DRAM may operate in a write mode PA and a hold mode PB. Carriers may be generated in the write mode PA and then stored in the hold mode PB. Referring to FIGS. 1 and 7, a drain voltage pulse DP and a source voltage SP may be applied to the drain region 150 and the source region 140, respectively, and one of gate voltage pulses GP1, GP2, and GP3 may be applied to the gate electrode 130. Voltage levels of the gate voltage pulses GP1, GP2, and GP3 in the write mode PA may be different from voltage levels of the gate voltage pulses GP1, GP2, and GP3 in the hold mode PB. A voltage level of the drain voltage pulse DP in the write mode PA may be different from a voltage level of the drain voltage pulse DP in the hold mode PB.

According to example embodiments, the voltage level of the gate voltage applied to the gate electrode 130 in the hold mode PB may be adjusted by selecting one of the gate voltage pulses GP1, GP2 and GP3. In the hold mode PB, the voltage level of the gate voltage pulse GP1 may be the highest and a voltage level of the gate voltage pulse GP3 may be the lowest. The voltage level of the gate voltage applied to the gate electrode 130 in the hold mode PB may be adjusted so that the amount of carriers (e.g., holes) stored in the body region 170 in the hold mode PB may be adjusted. If the carriers are holes and the voltage level of the gate voltage pulse GP1, GP2 or GP3 in the hold mode PB is lower than about 0V, when the gate voltage pulse GP1 having the highest voltage level in the hold mode PB is applied to the gate electrode 130, the amount of holes stored in the hold mode PB may be reduced. When the gate voltage pulse GP3 having the lowest voltage level in the hold mode PB is applied to the gate electrode 130, the amount of holes stored in the hold mode PB may be increased.

Figure 8:
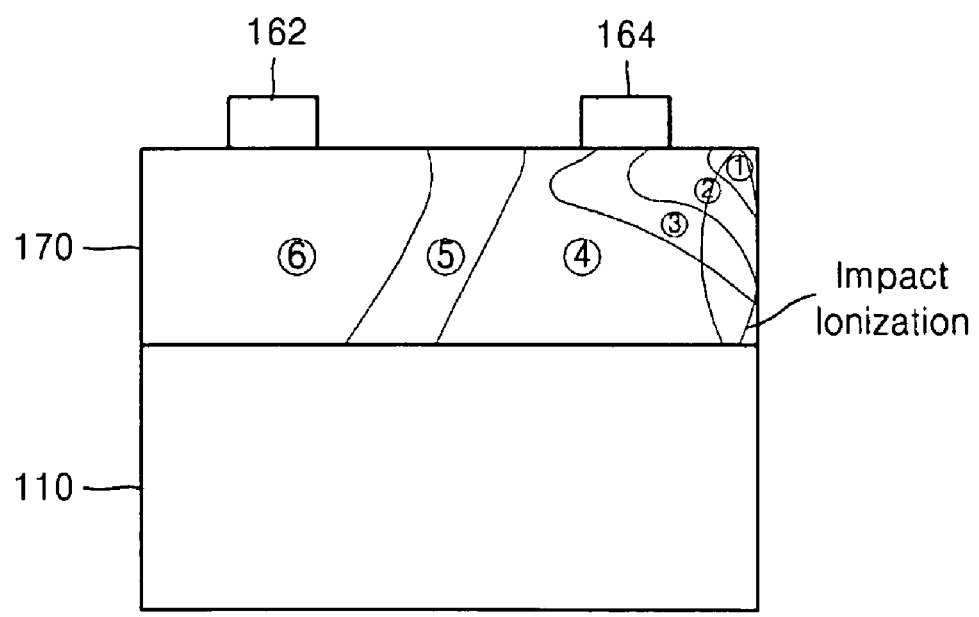

FIG. 8 is a cross-sectional diagram illustrating a carrier concentration distribution generated in the write mode PA of FIG. 7. Referring to FIG. 8, carriers may be generated near the drain electrode 164 in the write mode PA due to impact ionization or avalanche breakdown and the carrier concentration may change as a function of distance from the drain electrode 164; carrier concentration may decrease as a function of distance from the drain electrode 164. In FIG. 8, the carrier concentration may decrease between reference numeral 1 and reference numeral 6 in the direction of ascending order.

Figure 9:
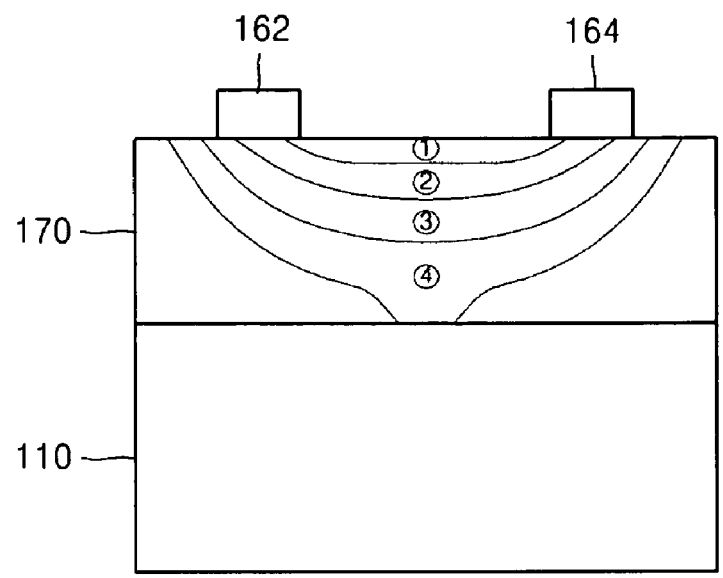
Figure 10:
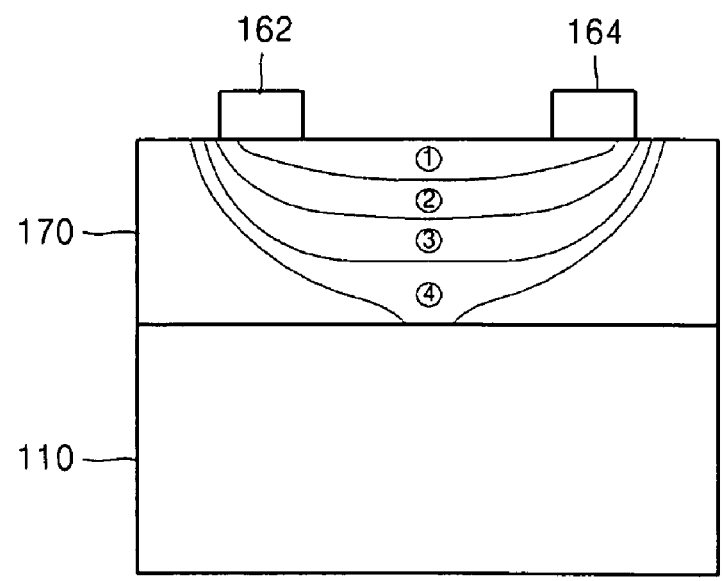
Figure 11:
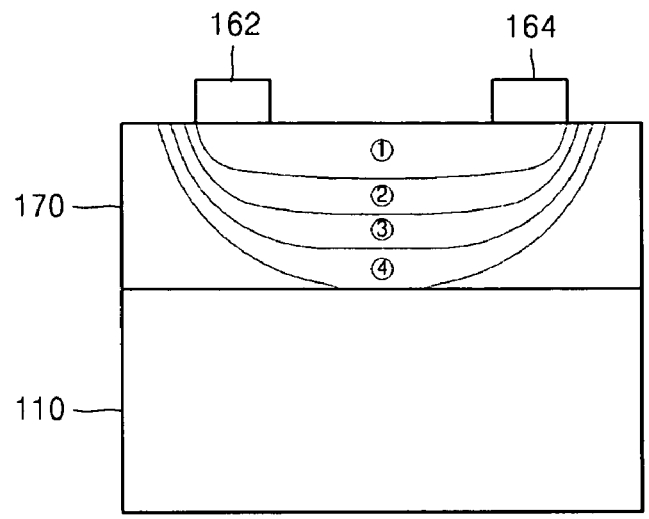

FIGS. 9-11 are cross-sectional diagrams illustrating carrier concentration distributions generated in the hold mode PB of FIG. 7. FIG. 9 illustrates a carrier concentration distribution where the gate voltage pulse GP1 of FIG. 7 is applied to a gate electrode 130. FIG. 10 illustrates a carrier concentration distribution where the gate voltage pulse GP2 of FIG. 7 is applied to the gate electrode 130. FIG. 11 illustrates a carrier concentration distribution where the gate voltage pulse GP3 of FIG. 7 is applied to a gate electrode 130. In FIGS. 9 through 11, carrier concentration may decrease between reference numeral 1 and reference numeral 4 in the direction of ascending order.

The widths of regions having the highest carrier concentrations (reference numerals 1) as illustrated in FIGS. 9-11 will now be compared. Comparing the regions of FIGS. 9 and 10, the region corresponding to numeral 1 of FIG. 10 (GP2) may be wider than the region corresponding to numeral 1 of FIG. 9 (GP1). When a gate voltage pulse GP2 is applied to a gate electrode 130, the amount of carriers stored may be increased. Comparing the regions of FIGS. 10 and 11, the region corresponding to reference numeral 1 of FIG. 11 (GP3) may be wider than the region corresponding to reference numeral 1 of FIG. 10 (GP2). When a gate voltage pulse GP3 is applied to a gate electrode 130, the amount of carriers stored may be increased. According to example embodiments of methods of operating a semiconductor device including the memory cell of a 1-T DRAM, the amount of carriers stored may be adjusted by adjusting voltage levels of gate voltage applied to a gate electrode 130 in a hold mode PB so that a data sense margin (as described with reference to FIG. 6) may be adjusted. The voltage levels of gate voltage applied to a gate electrode 130 in a hold mode PB may be adjusted after memory test.

Figure 12:
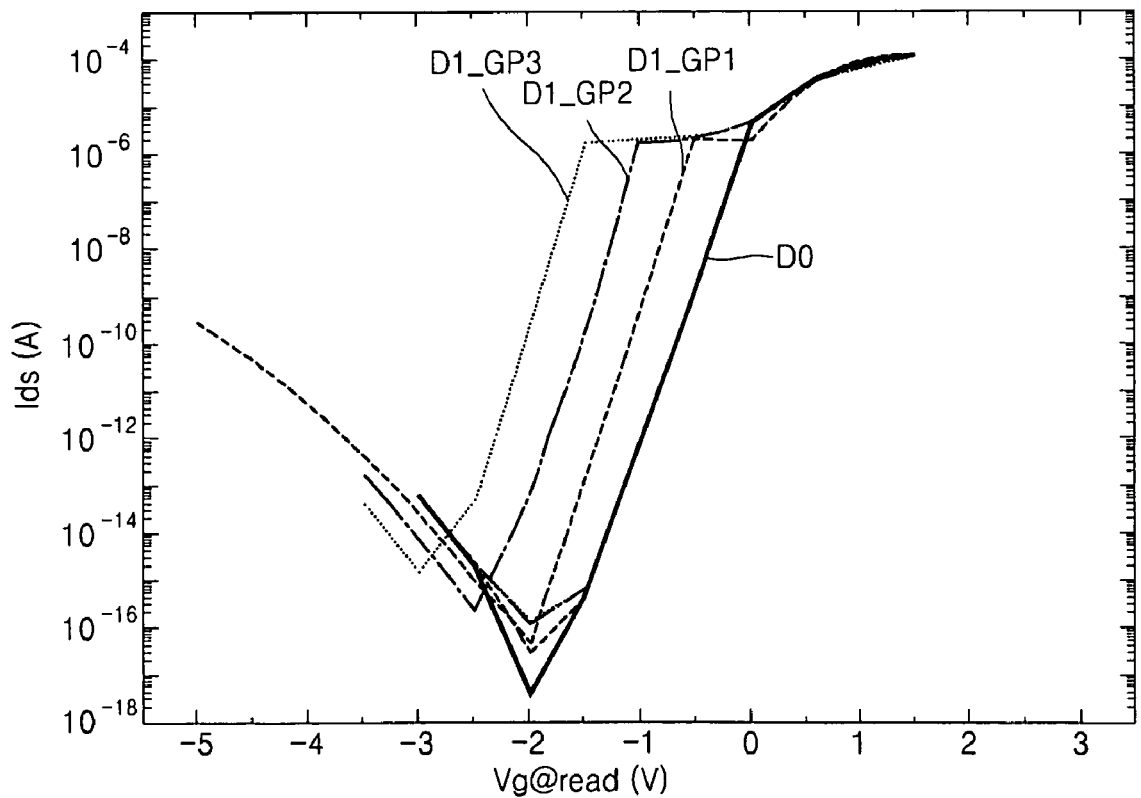

FIG. 12 is a graph of drain/source current ($I_{ds}$) as a function of gate voltage ($V_g$) of a read operation, illustrating sense margins resulting from gate voltage pulses applied in a write mode and a hold mode, according to example embodiments. Referring to FIG. 12, D1_GP1, D1_GP2, and D1_GP3 may show the relationship between a gate read voltage and a current flowing between drain and source regions 150 and 140, after gate voltage pulses GP1, GP2, and GP3 of FIG. 7 have been applied to the gate electrode 130 and carriers have been stored in the body region 170. D0 may show the relationship between the gate read voltage and the current when the carriers are not stored in the body region 170.

Referring to FIG. 12, a sense margin after the gate voltage pulse GP1 is applied to the gate electrode 130 may be an interval between D1_GP1 and D0. A sense margin after the gate voltage pulse GP2 is applied to the gate electrode 130 may be an interval between D1_GP2 and D0. A sense margin after the gate voltage pulse GP3 is applied to the gate electrode 130 may be an interval between D1_GP3 and D0. The sense margin after the gate voltage pulse GP3 is applied to a gate electrode 130 may be larger than the sense margin after a gate voltage pulse GP1 is applied to the gate electrode 130. As described with respect to FIG. 7, the amount of carriers stored by a gate voltage pulse GP3 applied to a gate electrode 130 may be larger than the amount of carriers stored by a gate voltage pulse GP1 applied to the gate electrode 130. According to example embodiments of methods of operating a semiconductor device, the amount of carriers stored may be increased by reducing the voltage levels of the gate voltage pulses GP1, GP2, and GP3 that are applied to the gate electrode 130 in the hold mode PB so that a data sense margin can be increased.

Referring to FIG. 7, after gate voltage pulses GP1, GP2, and GP3 applied to a gate electrode 130 are transitioned to a standby voltage from an enable voltage, the drain voltage pulse DP applied to a drain region 150 may be transitioned to a standby voltage from an enable voltage. Alternatively, the timing at which gate voltage pulses GP1, GP2, and GP3 are transitioned to a standby voltage from an enable voltage may be the same as the timing at which a drain voltage pulse DP is transitioned to a standby voltage from an enable voltage. In FIG. 7, the enable timing at which a drain voltage pulse DP is transitioned to an enable voltage from a standby voltage may be the same as the enable timing at which gate voltage pulses GP1, GP2, and GP3 may be transitioned to an enable voltage from a standby voltage. However, example embodiments are not limited thereto and the enable timing of a drain voltage pulse DP may be slower than or faster than the enable timing of gate voltage pulses GP1, GP2, and GP3. The source voltage SP applied to a source region 140 in the write mode PA and the hold mode PB may have a constant voltage level. In FIG. 7, the hold mode PB is illustrated after the write mode PA. However, the hold mode PB may exist before the write mode PA. For example, the hold mode PB may exist prior to the increase in voltage levels of the gate voltage pulses GP1, GP2, and GP3. The enable voltage means the enable-state voltage level and the standby voltage means the standby-state voltage level. The standby voltage may be the hold voltage. The enable state is the state of a pulse which may be a positive pulse or a negative pulse. The standby state is the state that is not a pulse state. Referring to FIG. 7, the state of the gate voltage pulses GP1, GP2 and GP3 in the write mode PA may be the enable state and the state of the gate voltage pulses GP1, GP2, and GP3 in the hold mode PB may be the standby state.

Figure 13:
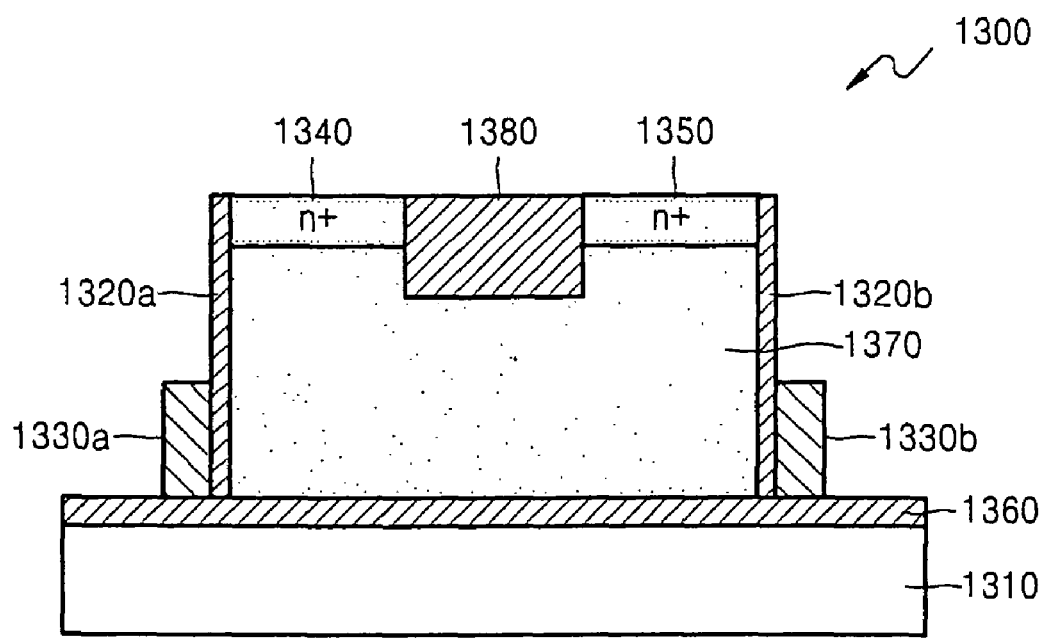

FIG. 13 is a cross-sectional diagram illustrating a memory cell of a 1T-DRAM device according to example embodiments. The memory cell 1300 of FIG. 13 may include an insulating layer 1360 on an semiconductor substrate 1310, a body region 1370, gate electrodes 1330a and 1330b, a first doped region 1340, and a second doped region 1350. The body region 1370 may be positioned on the insulating layer 1360. The gate electrodes 1330a and 1330b may be positioned on the insulating layer 1360 and may be arranged at sides of the body region 1370. The first and second doped regions 1340 and 1350 may be positioned above the body region 1370. The first doped region 1340 and the second doped region 1350 may be a drain region and/or a source region.

The gate electrodes 1330a and 1330b may be separated from the first and second doped regions 1340 and 1350 in a vertical direction. The gate electrodes 1330a and 1330b and the first and second doped regions 1340 and 1350 may not overlap with one another. The gate electrodes 1330a and 1330b may extend in a direction perpendicular to a longer side of the body region 1370. For example, in FIG. 13, the gate electrodes 1330a and 1330b may extend in a direction crossing longer sides of the body region 1370. The first doped region 1340 and the second doped region 1350 may protrude from a top surface of the body region 1370 and may be separated from each other. An isolation oxide region 1380 may be between the first doped region 1340 and the second doped region 1350.

The isolation oxide region 1380 may be formed of material including an oxide. However, the isolation oxide region 1380 may be replaced with an insulating region formed of insulating materials. The isolation oxide region 1380 according to example embodiments may be replaced with other insulating regions. The isolation oxide region is not limited to a specific region or insulating material. The memory cell 1300 of the 1T-DRAM device of FIG. 13 may include a gate insulating regions 1320a and 1320b. The gate insulating regions 1320a and 1320b may be between the gate electrodes 1330a and 1330b and the body region 1370. The gate insulating regions 1320a and 1320b may respectively insulate the gate electrodes 1330a and 1330b from the body region 1370.

The memory cell 1300 of the 1T-DRAM device of FIG. 13 may further include a buried oxide (BOX) region (not shown) formed in the semiconductor substrate 1310. The BOX region may formed by forming an oxide region in a bulk substrate that is the semiconductor substrate 1310. The BOX region may be an insulating region of a silicon-on-insulator (SOI) substrate that is the semiconductor substrate 1310.

Figure 14:
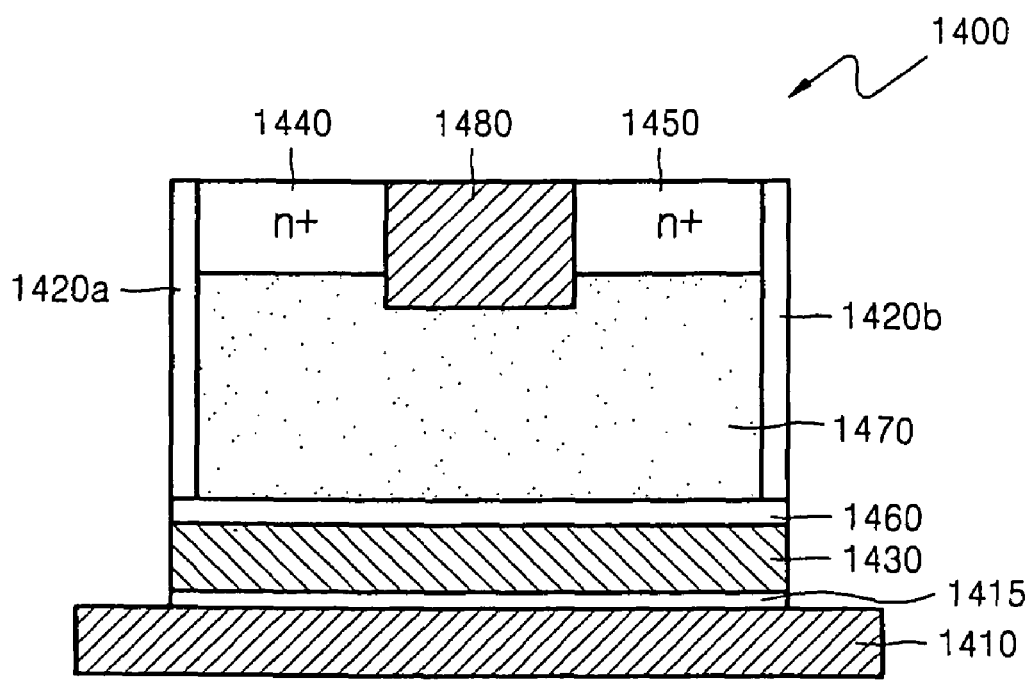

FIG. 14 is a cross-sectional diagram illustrating a memory cell of a 1T-DRAM device according to example embodiments. The memory cell 1400 of FIG. 14 may include a semiconductor substrate 1410, a gate electrode 1430, a gate insulating region 1460, a body region 1470, a first doped region 1440 and a second doped region 1450. The gate electrode 1430 may be positioned on the semiconductor substrate 1410 and the body region 1470 may be positioned on the gate electrode 1430. The first and second doped regions 1440 and 1450 may be positioned above the body region 1470. The gate pattern 1430 may be below the body region 1470 and the first and second doped regions 1440 and 1450. The body region 1470 may be a floating body region separated from the semiconductor substrate 1410. The body region 1470 and the semiconductor substrate 1410 may be formed of a material having the same properties.

The memory cell 1400 illustrated in FIG. 14 of a 1T-DRAM device may include a buried oxide (BOX) region 1415 formed in and/or on the semiconductor substrate 1410. The memory cell 1400 illustrated in FIG. 14 of a 1T-DRAM device may include insulating regions 1420a and 1420b. The insulating regions 1420a and 1420b may be on sides of the body region 1470. The insulating regions 1420a and 1420b may be on sides of the gate pattern 1430 and the body region 1470. The gate insulating region 1460 may insulate the gate electrode 1430 and the body region 1470. The operating method of FIG. 7 may be applicable to each of the memory cells of the 1T-DRAM device in FIG. 13 and FIG. 14.

While example embodiments have been particularly shown and described, it will be understood by one of ordinary skill in the art that variations in form and detail may be made therein without departing from the spirit and scope of the claims.

What is claimed is:

1. A method of operating a semiconductor device having at least one memory cell including a drain region, a source region, a floating body region, and a gate electrode, the method comprising:
    applying a first gate voltage to the gate electrode and a first drain voltage to the drain region, in a write mode, to change a data state of the memory cell to a first state; and
    applying an adjustable second gate voltage to the gate electrode and a second drain voltage to the drain region, in a hold mode after the write mode.

2. The method of claim 1, wherein the adjustable second gate voltage is adjusted so that a concentration distribution of carriers stored in the floating body region is adjusted.

3. The method of claim 2, wherein the carriers are holes.

4. The method of claim 3, wherein the adjustable second gate voltage is adjusted within a range of negative voltage levels.

5. The method of claim 4, wherein the voltage level of the adjustable second gate voltage is less than the voltage level of the first gate voltage, and
    the voltage level of the second drain voltage is less than the voltage level of the first drain voltage.

6. The method of claim 1, further comprising applying the adjustable second gate voltage to the gate electrode in a hold mode before the write mode.

7. The method of claim 1, further comprising:
    applying a third gate voltage to the gate electrode in a read mode; and
    detecting the data state of the memory cell,
    wherein detecting the data state of the memory cell includes detecting variation in the data state according to a sense margin established by the adjustable second gate voltage applied in the hold mode.

8. The method of claim 1, wherein a gate voltage applied to the gate electrode is transitioned from the first gate voltage to the adjustable second gate voltage and then a drain voltage applied to the drain region is transitioned from the first drain voltage to the second drain voltage.

9. The method of claim 1, wherein a source voltage applied to the source region has a constant voltage level in the write mode.

10. A transistor-dynamic random access memory 1T-DRAM device operated by the method of claim 1.

11. The method of claim 1, wherein the semiconductor device further includes a semiconductor substrate, the floating body region on the semiconductor substrate,
    a plurality of gate electrodes positioned on the semiconductor substrate at sides of the floating body region, and
    first and second doped regions above the body region.

12. The method of claim 11, wherein the gate electrodes are separated from the first and second doped regions in a vertical direction so that the gate electrodes do not overlap the first and second doped regions.

13. The method of claim 1, wherein the semiconductor device further includes
    a semiconductor substrate,
    the gate electrode on the semiconductor substrate,
    the floating body region on the gate pattern, and
    first and second doped regions above the body region.

14. A method of operating at least one semiconductor device including a drain region, a source region, a floating body region, and a gate pattern, the method comprising:
    applying a first gate voltage to the gate pattern and a first drain voltage to the drain region, in a write mode, to change a data state of the semiconductor device to a first state; and
    applying a second gate voltage to the gate pattern and a second drain voltage to the drain region, in a hold mode after the write mode,
    wherein a difference between the first gate voltage and the second gate voltage is an adjustable difference.

15. The method of claim 14, wherein the adjustable difference between the first gate voltage and the second gate voltage is increased to increase an amount of holes stored in the floating body region.

16. The method of claim 14, wherein the adjustable difference between the first gate voltage and the second gate voltage is increased so that in a read mode after the hold mode a sense margin is increased.

17. A method of operating a semiconductor device including at least one memory cell including a drain region, a source region, a floating body region, and a gate electrode, the method comprising:
    applying an activation period of a gate voltage pulse to the gate electrode and applying an activation period of a drain voltage pulse to the drain region, in a write mode, to change the data state of the memory device to a first state; and
    applying a deactivation period of the gate voltage pulse to the gate electrode, a voltage level of the deactivation period of the voltage pulse being adjustable, and applying a deactivation period of the drain voltage pulse to the drain region, in a hold mode after the write mode.

18. The method of claim 17, wherein after the gate voltage pulse is transitioned to the deactivation period from the activation period, the drain voltage pulse is transitioned to the deactivation period from the activation period.

19. The method of claim 17, wherein the voltage level of the gate voltage in the deactivation period is adjusted so that an amount of carriers stored in the floating body region is adjusted.

20. The method of claim 17, wherein the gate voltage pulse is a positive pulse or negative pulse, and the drain voltage pulse is a positive pulse.

* * * * *